United States Patent
Liao et al.

(10) Patent No.: US 11,414,532 B2
(45) Date of Patent: Aug. 16, 2022

(54) RESIN COMPOSITION, AND PREPREG, METAL-CLAD LAMINATE, AND PRINTED CIRCUIT BOARD USING THE SAME

(71) Applicant: TAIWAN UNION TECHNOLOGY CORPORATION, Chupei (TW)

(72) Inventors: Chih-Wei Liao, Chupei (TW); Guan-Syun Tseng, Chupei (TW); Tsung-Hsien Lin, Chupei (TW); Ju-Ming Huang, Chupei (TW)

(73) Assignee: TAIWAN UNION TECHNOLOGY CORPORATION, Chupei (TW)

(*) Notice: Subject to any disclaimer, the term of this patent is extended or adjusted under 35 U.S.C. 154(b) by 178 days.

(21) Appl. No.: 16/123,509

(22) Filed: Sep. 6, 2018

(65) Prior Publication Data

US 2019/0382556 A1 Dec. 19, 2019

(30) Foreign Application Priority Data

Jun. 13, 2018 (TW) .................................. 107120395

(51) Int. Cl.
| | |
|---|---|
| *C08K 5/357* | (2006.01) |
| *C08J 5/24* | (2006.01) |
| *H05K 1/03* | (2006.01) |
| *H05K 3/02* | (2006.01) |
| *G01N 17/00* | (2006.01) |
| *H05K 1/02* | (2006.01) |
| *B32B 15/092* | (2006.01) |

(52) U.S. Cl.
CPC ................. *C08K 5/357* (2013.01); *C08J 5/24* (2013.01); *H05K 1/0346* (2013.01); *H05K 1/0373* (2013.01); *H05K 3/022* (2013.01); *C08J 2363/00* (2013.01); *G01N 17/006* (2013.01); *H05K 1/024* (2013.01); *H05K 2201/012* (2013.01); *H05K 2203/0776* (2013.01); *H05K 2203/1105* (2013.01); *H05K 2203/162* (2013.01)

(58) Field of Classification Search
None
See application file for complete search history.

(56) References Cited

U.S. PATENT DOCUMENTS

| | | | |
|---|---|---|---|
| 4,435,560 A | 3/1984 | Takahashi et al. | |
| 5,639,808 A * | 6/1997 | Coggio ................ | C08K 5/5399 428/378 |
| 5,945,222 A | 8/1999 | Nagase et al. | |
| 2013/0217820 A1 | 8/2013 | Nakao et al. | |
| 2014/0199549 A1* | 7/2014 | Shin ..................... | C09D 133/02 428/402 |
| 2017/0283558 A1 | 10/2017 | Gorodisher et al. | |
| 2017/0327683 A1 | 11/2017 | Hu et al. | |

FOREIGN PATENT DOCUMENTS

| | | | |
|---|---|---|---|
| CN | 103210009 B | | 9/2014 |
| JP | 2014232854 A | * | 12/2014 |
| TW | 460537 B | | 10/2001 |
| TW | 201313081 A1 | | 3/2013 |
| TW | I610982 B | | 1/2018 |
| WO | WO-2016099988 A1 | * | 6/2016 ......... C08G 73/0233 |

OTHER PUBLICATIONS

Taiwanese Office Action dated Feb. 12, 2020.
Taiwanese Office Action dated Dec. 31, 2019.

* cited by examiner

*Primary Examiner* — Randy P Gulakowski
*Assistant Examiner* — Ha S Nguyen
(74) *Attorney, Agent, or Firm* — Ferrells, PLLC; Anna L. Kinney; Michael W. Ferrell

(57) ABSTRACT

A resin composition is provided. The resin composition comprises the following constituents:
(A) epoxy resin;
(B) a compound of formula (I), formula (I)

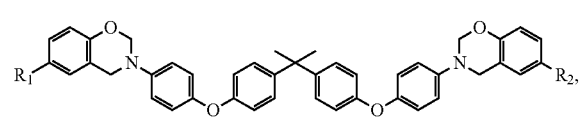

in formula (I), $R_1$ and $R_2$ are independently —H, —$CH_3$, or —$C(CH_3)$; and
(C) an optional filler.

14 Claims, No Drawings

RESIN COMPOSITION, AND PREPREG, METAL-CLAD LAMINATE, AND PRINTED CIRCUIT BOARD USING THE SAME

CLAIM FOR PRIORITY

This application claims the benefit of Taiwan Patent Application No. 107120395 filed on Jun. 13, 2018, the subject matters of which are incorporated herein in their entirety by reference.

BACKGROUND OF THE INVENTION

Field of the Invention

The present invention provides a resin composition, especially an epoxy resin-based resin composition of electronic materials having the following advantages: low dielectric constant (Dk), low dissipation factor (Df), low water absorbance, good heat resistance and good finished appearance. The resin composition of the present invention can be used in combination with glass fibers to constitute a composite material or prepreg. Furthermore, it can be used as a metal foil adhesive to manufacture a laminate, a printed circuit board and an integrated circuit-carrying substrate.

Descriptions of the Related Art

In the field of electronic telecommunications, electronic products are designed to operate in ever higher frequency regions due to the increasing amount of data transmission and, as a result, the requirements for the dielectric properties (i.e. Dk and Df) of the related electronic materials must increase. In addition, the soldering temperature for printed circuit boards has become higher due to the utilization of the lead-free process, which in turn requires the heat resistance of the dielectric layer material of the metal-clad laminates for the printed circuit boards to be greater. Furthermore, the increasing wiring density of printed circuit boards requires the diameters of the micro-holes connecting the layers of the multi-layer circuit boards to be smaller, with the pitch between the micro-holes being narrower (for example, only 0.8 mm or 0.65 mm), such that there is an increased need for the high-temperature reliability of such printed circuit boards.

Epoxy resin is a thermosetting resin, which has been used in electronic materials for a long time. In the past, an epoxy resin and a phenolic novolac resin were often used in the form of a resin composition, thereby improving the heat resistance of the resulting resin composition after being cured. However, by-products were produced during the curing reaction of the epoxy resin and phenolic novolac resin, resulting in poor physicochemical properties of the resin composition after being cured. To try to address this technical problem, attempts have been made to replace the phenolic novolac resin with a benzoxazine resin (herein also called BZ resin) as a hardener. Since the hardening mechanism of the BZ resin is a ring-opening-polymerization reaction that hardly generates volatile by-products, the BZ resin has gradually become widely used in epoxy resin-based resin compositions.

The application of BZ resin was early disclosed in TW 460537, in which a BZ compound was produced by a reaction of a phenol, a monoamine compound, and a formaldehyde, which can be used in combination with an epoxy resin or a phenolic novolac resin as a hardener. In addition, commercially available BZ hardeners also include: bisphenol A-type BZ (herein also called BPA-BZ), for example LZ-8290 available from the Hunstman company; bisphenol F-type BZ (herein also called BPF-BZ), for example LZ-8280 available from the Hunstman company; and phenolphthalein-type BZ, for example LZ-8270 available from the Hunstman company. However, the electronic materials prepared by using the above BZ hardeners still have the problem of insufficient heat resistance.

To further improve the heat resistance, attempts have been made to replace the monoamine compound with a di-amine compound having two amino groups in the synthesis of a BZ compound to obtain a BZ hardener having improved heat resistance. For example, CN 103210009 B discloses an ODA-type BZ hardener formed from the reaction of phenol, 4,4'-diaminodiphenyl ether (also called 4-4'-oxydianiline (4-4'-ODA)) and formaldehyde, wherein electronic materials prepared by using the same exhibit good heat resistance and excellent flame retardance. Commercially available ODA-type BZ hardeners include for example, PF-3500

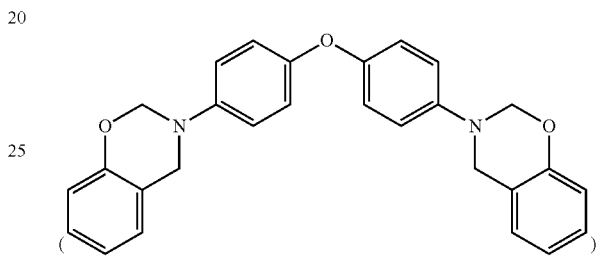

available from Chang Chun (CCP) company and JBZ-OP100N

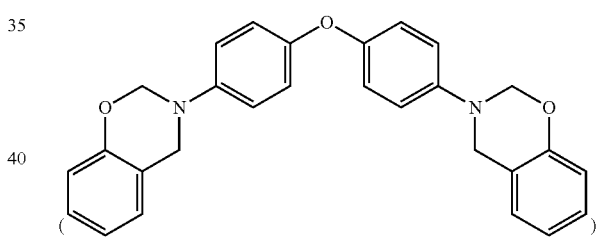

available from JFE Chemicals company.

In addition, TW 1610982 also discloses an epoxy resin-based resin composition that uses the same ODA-type BZ hardener as described in CN 103210009 B, further combined with a styrene maleic anhydride copolymer (SMA copolymer) and a tetra-functional phenol compound, so as to improve the heat resistance of the electronic materials prepared therefrom.

SUMMARY OF THE INVENTION

It has been found that, in comparison with electronic materials prepared from resin compositions containing BPA-BZ hardeners, electronic materials prepared from resin compositions containing ODA-type BZ harderers can exhibit improved glass transition temperature (Tg). However, they still have the problem of poor dielectric properties (i.e., Dk and Df), especially the problem of the dissipation factor (Df) being too high when applied in high-frequency electronic products. In addition, it has also been found that electronic materials prepared from resin compositions containing ODA-type BZ hardeners still have the problem of appearance defects (e.g., fisheyes), resulting in poor yield.

In view of the abovementioned technical problems, the present invention provides a resin composition, which can be used to prepare electronic materials with the following advantages: higher heat resistance, better dielectrical properties (i.e., lower Dk and Df), improved appearance and so on. As described in the following objectives of the present invention, the technical means applied in the present invention for solving the problems of the prior art is to use a benzoxazine resin having a specific structure in an epoxy resin-based resin composition, so that the electronic materials prepared from the resin composition have the above advantages, especially improved dielectric properties and finished appearances.

An objective of the present invention is to provide a resin composition, comprising:
(A) an epoxy resin;
(B) a compound of formula (I),

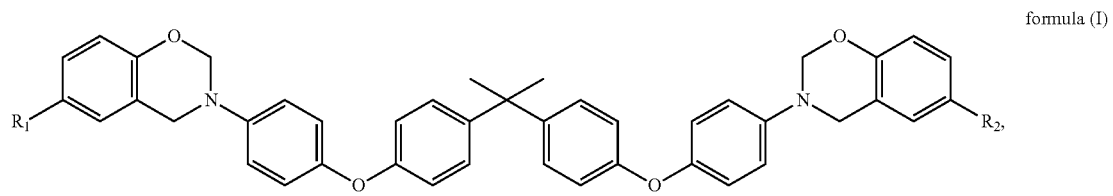

formula (I)

wherein, in formula (I), $R_1$ and $R_2$ are independently —H, —$CH_3$, or —$C(CH_3)_3$; and (C) an optional filler.

In some embodiments of the present invention, in formula (I), $R_1$ and $R_2$ are both —H.

In some embodiments of the present invention, the optional filler (C) is selected from the group consisting of silicon dioxide, aluminum oxide, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartz, diamond, diamond-like, graphite, calcined kaolin, pryan, mica, hydrotalcite, polytetrafluoroethylene (PTFE) powder, glass bead, ceramic whisker, carbon nanotube, nanosized inorganic powder, and combinations thereof.

In some embodiments of the present invention, the resin composition further comprises a crosslinking agent selected from the group consisting of a maleimide-based compound, an anhydride, and combinations thereof.

In some embodiments of the present invention, the maleimide-based compound is the compound of formula (II):

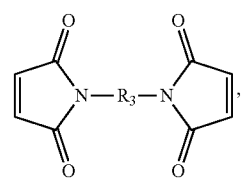

formula (II)

wherein, in formula (II), $R_3$ is methylene (—$CH_2$—), 4,4'-diphenylmethane group

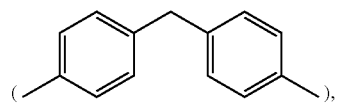

m-phenylene

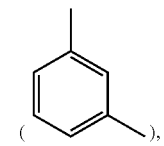

bisphenol A diphenyl ether group

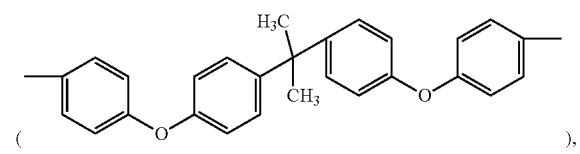

3,3'-dimethyl-5,5'-diethyl-4,4'-diphenylmethane group

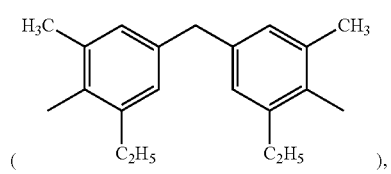

4-methyl-1,3-phenylene

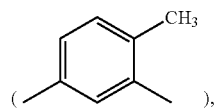

or
2,2,4-trimethyl-1,6-hexamethylene

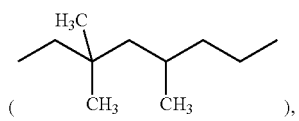

and preferably 3,3'-dimethyl-5,5'-diethyl-4,4'-diphenylmethane group

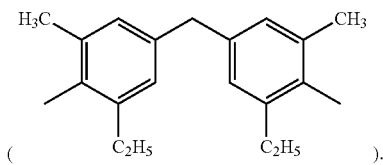

In some embodiments of the present invention, the anhydride is a copolymer of styrene and maleic anhydride, wherein, in the copolymer of styrene and maleic anhydride, the molar ratio of repeating units derived from styrene to repeating units derived from maleic anhydride is about 3 to about 8, particularly about 3.5 to about 4.5 and more particularly about 4.

In some embodiments of the present invention, based on the dry weight of the resin composition excluding the optional filler (C), the content of the compound (B) of formula (I) ranges from about 6 wt % to about 40 wt %.

In some embodiments of the present invention, the resin composition further comprises a co-crosslinking agent selected from the group consisting of a cyanate ester resin, an OH group-containing compound, an amino group-containing compound, an active ester-containing compound, and combinations thereof.

In some embodiments of the present invention, the resin composition further comprises at least one of a flame retardant and a curing accelerator.

In some embodiments of the present invention, the resin composition further comprises at least one of a dispersing agent and a coupling agent.

Another objective of the present invention is to provide a prepreg, which is prepared by impregnating a substrate with the abovementioned resin composition or by coating the abovementioned resin composition onto a substrate, and drying the impregnated or coated substrate.

Yet another objective of the present invention is to provide a metal-clad laminate, which is prepared by laminating the abovementioned prepreg and a metal foil, or by directly coating the abovementioned resin composition onto a metal foil and drying the coated metal foil.

Yet another objective of the present invention is to provide a printed circuit board, which is prepared from the abovementioned metal-clad laminate.

To render the above objectives, technical features and advantages of the present invention more apparent, the present invention will be described in detail with reference to some embodiments hereinafter.

BRIEF DESCRIPTION OF THE DRAWINGS

Not applicable.

DESCRIPTION OF THE PREFERRED EMBODIMENT

Hereinafter, some embodiments of the present invention will be described in detail. However, without departing from the spirit of the present invention, the present invention may be embodied in various embodiments and should not be limited to the embodiments described in the specification.

Unless it is additionally explained, the expressions "a," "the," or the like recited in the specification (especially in the claims) should include both the singular and the plural forms.

Unless it is additionally explained, while describing constituents in a solution, mixture or composition in the specification, the amount of each constituent is calculated based on the dry weight, i.e., regardless of the weight of the solvent.

As used herein, the expression "about" suggests that the designated amount may increase or decrease a magnitude that is general and reasonable to persons skilled in the art.

Compared with the prior art, the feature of the present invention lies in that the resin composition of the present invention includes a benzoxazine resin with a specific structure, which can improve the dielectric properties of the electronic material prepared therefrom. The benzoxazine structure at the end of the molecular structure can impart a good heat resistance to the prepared electronic material. In addition, the benzoxazine resin with the specific structure has a good compatibility with an epoxy resin and well-known crosslinking agents, such as a bismaleimide resin or an SMA resin and thus, the prepared electronic material has a good finished appearance. The detailed descriptions for each component of the resin composition and the preparation method of the resin composition are provided as follows.

1. Resin Composition

The resin composition of the present invention comprises an epoxy resin (A) and a compound (B) represented by formula (I) as necessary components, and an optional filler (C) together with other optional components (D) that may be used depending on the need. The detailed descriptions for each component of the resin composition are provided as follows.

1.1. Epoxy Resin (A)

As used herein, an epoxy resin refers to a thermal hardening resin with at least two epoxy functional groups in each molecule, including but are not limited to a bifunctional epoxy resin, a tetrafunctional epoxy resin, an octafunctional epoxy resin, or a linear phenolic epoxy resin. In the resin composition of the present invention, the type of the epoxy resin is not particularly limited. The epoxy resin can be used by persons having ordinary skill in the art depending on the need based on the disclosure of the present invention. For example, when the flame retardance of the resin composition is taken into consideration, a halogen-containing epoxy resin is used; or when halogen-free enviromental requirements are taken into consideration, a halogen-free epoxy resin is used.

The epoxy resin can be used in the present invention, including: a bisphenol epoxy resin, a phenolic epoxy resin, a diphenylethylene epoxy resin, a triazine skeleton-containing epoxy resin, a triphenol methane epoxy resin, a xylylene epoxy resin, a biphenyl epoxy resin, a biphenyl aralkyl epoxy resin, a naphthalene epoxy resin, a fluorene skeleton-containing epoxy resin, a dicyclopentadiene (DCPD-type) epoxy resin, and an alicyclic epoxy resin. The bisphenol epoxy resin is, for example, bisphenol A epoxy resin, bisphenol F epoxy resin or bisphenol S epoxy resin. The phenolic epoxy resin is, for example, phenol phenolic epoxy resin, cresol phenolic epoxy resin, bisphenol A phenolic epoxy resin or bisphenol F phenolic epoxy resin.

Examples of the epoxy resin which can be used in the present invention, include but are not limited to 1,4-butanediol diglycidyl ether, 1,6-hexanediol diglycidyl ether, (poly)ethylene glycol diglycidyl ether, (poly)propylene glycol diglycidyl ether, trimethylolethane triglycidyl ether, trimethylolpropane triglycidyl ether, 1,4-cyclohexane dimethanol diglycidyl ether, 1,2-epoxy-4-(epoxyethyl) cyclohexane, glycerol triglycidyl ether, diglycerol poly diglycidyl ether, 2,6-diglycidyl phenyl glycidyl ether, 1,1,3-tris(4-glycidyloxyphenyl)propane, diglycidyl 1,2-cyclohexanedicarboxylate, 4,4'-methylenebis(N,N-diglycidyl aniline), 3',4'-epoxycyclohexylmethyl 3,4-epoxycyclohexanecarboxylate, triglycidyl-p-aminophenol, tetraglycidyl-m-xylylenediamine, tetraglycidyl diamino diphenylmethane, tetraglycidyl-1,3-bisaminomethylcyclohexane, bisphenol A diglycidyl ether, bisphenol S diglycidyl ether, tetrabromobisphenol A diglycidyl ether, hydrogenated bisphenol A diglycidyl ether, pentaerythritol diglycidyl ether, pentaerythritol tetraglycidyl ether, pentaerythritol polyglycidyl ether, resorcinol diglycidyl ether, diglycidyl phthalate, diglycidyl tetrahydrophthalate, neopentyl glycol diglycidyl ether, bisphenol hexafluoroacetone diglycidyl ether, triglycidyl isocyanurate, tris(3,4-epoxybutyl) isocyanurate, tris(4,5-epoxypentyl) isocyanurate, tris(5,6-epoxyhexyl) isocyanurate, tris(7,8-epoxyoctyl) isocyanurate, tris(2-glycidoxyethyl) isocyanurate, monoallyl diglycidyl isocyanurate, N,N'-diglycidyl-N"-(2,3-dipropionyloxypropyl)isocyanurate, N,N'-bis(2,3-dipropionyloxypropyl)-N"-glycidyl isocyanurate, tris(2,2-bis(glycidoxymethyl)butyl)-3,3',3"-(2,4,6-trioxo-1,3,5-triazine-1,3,5-triyl) tripropionate, sorbitol polyglycidyl ether, diglycidyl adipate, dibromophenyl glycidyl ether, 1,2,7,8-diepoxyoctane, 1,6-dimethylol perfluorohexane diglycidyl ether, 4-(spiro[3,4-epoxycyclohexane-1,5'-[1,3]dioxane]-2'-yl)-1,2-epoxycyclohexane, 1,2-bis(3,4-epoxycyclohexylmethoxy)ethane, 4',5'-epoxy-2-methylcyclohexylmethyl 4,5-epoxy-2'-methylcyclohexanecarboxylate, ethylene glycol bis(3,4-epoxycyclohexane carboxylate), bis(3,4-epoxycyclohexylmethyl) adipate, and bis(2,3-epoxycyclopentyl) ether. Furthermore, phosphorus may be introduced into the epoxy resin to provide a phosphorus-containing epoxy resin. An example of the phosphorus-containing epoxy resin is a DOPO-modified epoxy resin, wherein DOPO is 9,10-dihydro-9-oxa-10-phosphahenanthrene-10-oxide.

The abovementioned epoxy resins can either be used alone or in any combination depending on the practical needs. In some embodiments of the present invention, it is preferable to use the epoxy resin having a high glass transition temperature. In the appended Examples, the phenolic epoxy resin is used.

In the resin composition of the present invention, based on the dry weight of the resin composition excluding the optional filler (C), the content of the epoxy resin (A) may range from about 5 wt % to about 30 wt %, and particularly from about 8 wt % to about 25 wt %, such as 9 wt %, 10 wt %, 11 wt %, 12 wt %, 13 wt %, 14 wt %, 15 wt %, 16 wt %, 17 wt %, 18 wt %, 19 wt %, 20 wt %, 21 wt %, 22 wt %, 23 wt %, or 24 wt %. Within the abovementioned ranges, the epoxy resin can fully exert its own advantages without affecting the properties of the other components in the resin composition. For instance, the prepared electronic materials can have good adhesion to metal foils and good insulation.

1.2. Compound (B) Presented by Formula (I)

The resin composition of the present invention comprises the compound presented by the following formula (I):

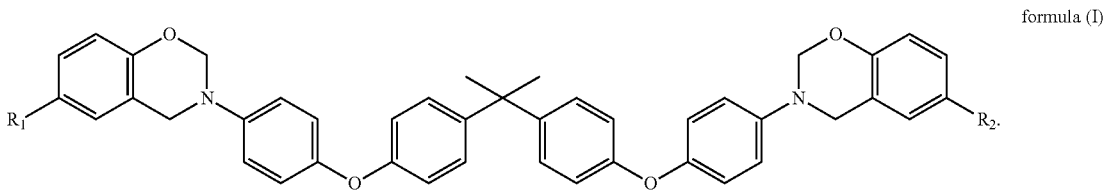

formula (I)

In formula (I), $R_1$ and $R_2$ are independently —H, —CH$_3$, or —C(CH$_3$)$_3$. In some embodiments of the present invention, $R_1$ and $R_2$ are both —H.

The compound presented by formula (I) is a benzoxazine resin, which can be prepared by a conventional method for preparing the benzoxazine resin, and the detailed description is provided as follows.

It is known that benzoxazine resin can be produced from a phenolic hydroxy compound, a monoamine compound and formaldehyde in accordance with the following reaction formula (a):

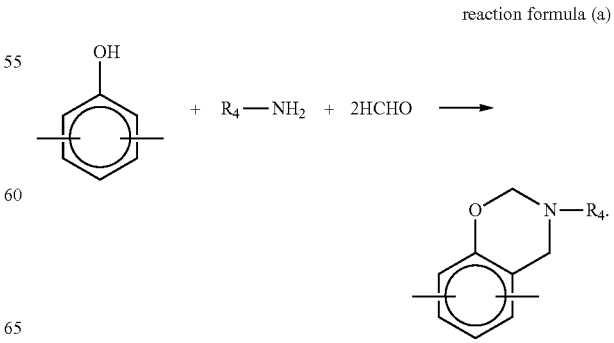

reaction formula (a)

In reaction formula (a), examples of the phenolic hydroxy compound include but are not limited to phenol, 4-methylphenol, tert-butylphenol, and so on. The $R_4$ group of the monoamine compound ($R_4$—$NH_2$) can be an alkyl group, a cycloalkyl group, a phenyl group, or an alkyl- or alkoxy-substituted phenyl group, such as methylamine, aniline and so on. Formaldehyde (HCHO) can be provided by formalin or paraformaldehyde.

The compound presented by formula (I) can be prepared by using a diamine, for example 2,2'-bis[4-(4-aminophenoxyphenyl)]propane (structural formula:

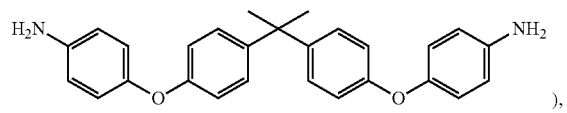

), to replace the monoamine compound ($R_4$—$NH_2$) in the reaction equation (a) and using 4-methylphenol as the phenolic hydroxy compound. The method for preparing the compound of formula (I) is not the technical feature of the present invention. Persons having ordinary skill in the art can easily obtain the compound of formula (I) based on the disclosure of the present invention or the preparation method recited in CN 103210009 B. The disclosure of CN 103210009 B is incorporated herein by reference in its entirety.

In the resin composition of the present invention, the compound presented by formula (I) can effectively lower the dielectric constant (Dk) and dissipation factor (Df) of electronic materials and further avoid the occurrence of fisheyes in the finished appearance of electronic materials. Therefore, the resin composition of the present invention is particularly suitable for the preparation of electronic materials useful for high frequency and high speed transmission.

In the resin composition of the present invention, based on the dry weight of the resin composition excluding the optional filler (C), the content of the compound (B) presented by formula (I) may range from about 3 wt % to about 50 wt %, and preferably from about 6 wt % to about 40 wt %, such as 7 wt %, 8 wt %, 9 wt %, 10 wt %, 12 wt %, 15 wt %, 17 wt %, 18 wt %, 19 wt %, 20 wt %, 22 wt %, 23 wt %, 25 wt %, 27 wt %, 29 wt %, 30 wt %, 31 wt %, 32 wt %, 33 wt %, 35 wt %, 36 wt %, 38 wt %, or 39 wt %. When the content of the compound (B) presented by formula (I) is within the abovementioned preferable ranges, electronic materials having a lower dissipation factor (Df) and better heat resistance can be obtained. In addition, in some preferred embodiments of the present invention, the content of the compound (B) presented by formula (I) may range from about 18 wt % to about 32 wt %, within which electronic materials having higher heat resistance for drilling can be obtained.

1.3. Optional Filler (C)

The resin composition of the present invention may optionally comprise fillers. Suitable fillers include but are not limited to the organic or inorganic fillers selected from the following group consisting of silicon dioxide (e.g., hollow silicon dioxide), aluminum oxide, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartz, diamond, diamond-like, graphite, calcined kaolin, pryan, mica, hydrotalcite, PTFE powder, glass bead, ceramic whisker, carbon nanotube, nanosized inorganic powder, and combinations thereof.

In the resin composition of the present invention, the shape of the filler is not particularly limited and may be, for example, a spherical shape, a fibrous shape, a plate shape, a granular shape, a sheet shape a whiskered shape, or the like, but the present invention is not limited thereto. Furthermore, the size of the filler is not particularly limited. In the case of a spherical or granular filler, the average particle diameter is generally less than 10 μm, and preferably from 0.1 μm to 5 μm.

In addition, to increase the compatibility between the filler and other components of the resin composition, the filler may be surface-modified with a coupling agent before being added into the resin composition. Examples of the coupling agent include but are not limited to silane-based coupling agents, titanate-based coupling agents, and polysiloxane coupling agents with low degree of polymerization.

In the resin composition of the present invention, based on the dry weight of the resin composition, the content of the filler may range from about 0 wt % to about 40 wt %, such as 2 wt %, 4 wt %, 6 wt %, 8 wt %, 10 wt %, 12 wt %, 14 wt %, 16 wt %, 18 wt %, 20 wt %, 22 wt %, 24 wt %, 25 wt %, 26 wt %, 27 wt %, 28 wt %, 30 wt %, 32 wt %, 34 wt %, 36 wt %, or 38 wt %, but the present invention is not limited thereto. Persons with ordinary skill in the art can adjust the amount of the filler depending on the need.

1.4. Other Optional Components (D)

The resin composition of the present invention may further comprise other optional components, such as the following crosslinking agents, flame retardants, curing accelerators and additives well-known to persons having ordinary skill in the art, to adaptively improve the workability of the resin composition during manufacturing or the physicochemical properties of the electronic material prepared from the resin composition. The additives well-known to persons having ordinary skill in the art include but are not limited to dispersing agents, coupling agents and tougheners.

1.4.1. Crosslinking Agent

As used herein, a crosslinking agent refers to a component which can react with an epoxy resin to undergo crosslinking and curing. The type of the crosslinking agent is not particularly limited as long as it can react with an epoxy resin. In the resin composition of the present invention, examples of the crosslinking agent include but are not limited to a maleimide-based compound, an anhydride, and combinations thereof. Without being bound by theory, the compound of formula (I) has good compatibility with either a maleimide-based compound, or an anhydride, and therefore the compound of formula (I) together with a maleimide-based compound and an anhydride is suitable to be used in an epoxy resin composition. Detailed descriptions for the examples of the crosslinking agent are provided below.

1.4.1.1. Maleimide

As used herein, a maleimide refers to a compound or oligomer with at least one of maleimido functional groups. The at least one maleimido functional group has reactive carbon-carbon double bonds and thus can react with other unsaturated functional groups to undergo crosslinking and curing and then improve the heat resistance of the material obtained after the resin composition is cured. Examples of the maleimide may include a bismaleimide having two maleimide functional groups and a poly-valent maleimide having three or more maleimide functional groups.

1.4.1.1.1. Bismaleimide

Specifically, the bismaleimide resin having two maleimide functional groups can be represented by the following formula (II):

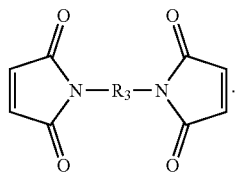

formula (II)

In formula (II), $R_3$ is methylene (—$CH_2$—), 4,4'-diphenylmethane

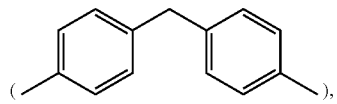

m-phenylene

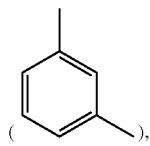

bisphenol A diphenyl ether

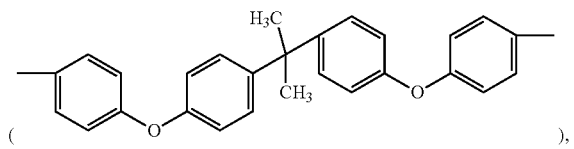

3,3'-dimethyl-5,5'-diethyl-4,4'-diphenylmethane group

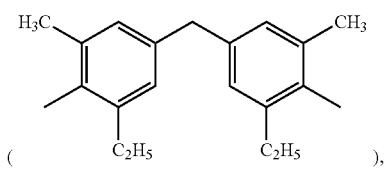

4-methyl-1,3-phenylene

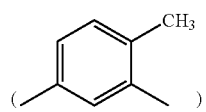

and 2,2',4-trimethyl-1,6-hexylene

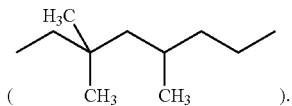

In some embodiments of the present invention, $R_3$ is 3,3'-dimethyl-5,5'-diethyl-4,4'-diphenylmethane group

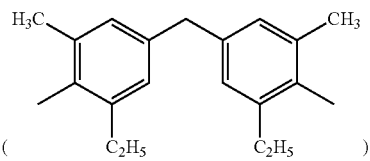

Examples of the compound of formula (II) include but are not limited to 1,2-bismaleimidoethane, 1,6-bismaleimidohexane, 1,3-bismaleimidobenzene, 1,4-bismaleimidobenzene, 2,4-bismaleimidotoluene, 4,4'-bismaleimidodiphenylmethane, 4,4'-bismaleimidodiphenyl ether, 3,3'-bismaleimidodiphenyl sulfone, 4,4'-bismaleimidodiphenyl sulfone, 4,4'-bismaleimidodicyclohexyl methane, 3,5-bis(4-maleimidophenyl)pyridine, 2,6-bismaleimidopyridine, 1,3-bis(maleimidomethyl)cylcohexane, 1,3-bis(maleimidomethyl)benzene, 1,1-bis(4-maleimidophenyl)cyclohexane, 1,3-bis(dichloromaleimido)benzene, 4,4'-biscitraconimidodiphenylmethane, 2,2-bis(4-maleimidophenyl)propane, 1-phenyl-1,1-bis(4-maleimidophenyl)ethane, α,α-bis(4-maleimidophenyl)toluene, 3,5-bismaleimido-1,2,4-triazole, N,N'-ethylenebismaleimide, N,N'-hexamethylenebismaleimide, N,N'-m-phenylenebismaleimide, N,N'-p-phenylenebismaleimide, N,N'-(4,4'-diphenylmethane)bismaleimide, N,N'-(4,4'-diphenyl ether) bismaleimide, N,N'-(4,4'-diphenylsulfone) bismaleimide, N,N'-(4,4'-dicyclohexylmethane) bismaleimide, N,N'-α,α'-4,4'-dimethylene cyclohexane bismaleimide, N,N'-m-dimethylphenylbismaleimide, N,N'-(4,4'-diphenylcyclohexane)bismaleimide and N,N'-methylene bis(3-chloro-p-phenylene) bismaleimide. Commercially available bismaleimide resins include BMI-70 and BMI-80 of KI Chemical company and BMI-1000, BMI-4000, BMI-5000 and BMI-7000 of Daiwa Fine Chemical company. The aforementioned bismaleimide can either be used alone or in any combination, and persons with ordinary skill in the art could adjust the amount of the bismaleimide depending on the need. In the appended examples, BMI-5100 ($R_3$ is 3,3'-dimethyl-5,5'-diethyl-4,4'-diphenylmethyl group

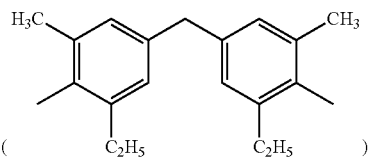

is used.

In the resin composition of the present invention, based on the dry weight of the resin composition excluding the optional filler (C), the content of the maleimide ranges from about 5 wt % to about 35 wt %, and particularly from about 10 wt % to about 30 wt %, such as 12 wt %, 13 wt %, 14 wt %, 15 wt %, 16 wt %, 17 wt %, 18 wt %, 19 wt %, 20 wt %, 22 wt %, 25 wt %, or 27 wt %.

1.4.1.1.2. Poly-Valent Maleimide

As used herein, a poly-valent maleimide refers to an oligomer with at least three of maleimide functional groups. In some embodiments of the present invention, the poly-valent maleimide resin can have the following formula (III):

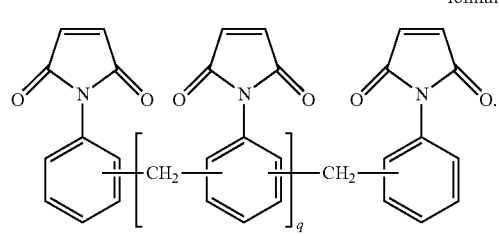

formula (III)

In formula (III), q is an integer of 1 to 10.

A poly-valent maleimide can be obtained by a condensation reaction of aniline, formaldehyde and maleic anhydride, and thus the poly-valent maleimide may also be a mixture of oligomers having different numbers of maleimide functional groups. The detailed description for the poly-valent maleimide of formula (III) can be found in, for example, U.S. Pat. No. 4,435,560. The subject matters of U.S. Pat. No. 4,435,560 are incorporated herein in its entirety by reference. Commercially available polyfunctional bismaleimide resins include BMI-2000 and BMI-2300 (CAS: 67784-74-1) of Daiwa Fine Chemical company.

In the resin composition of the present invention, based on the dry weight of the resin composition excluding the optional filler (C), the content of the poly-valent maleimide may range from about 5 wt % to about 35 wt %, and particularly from about 10 wt % to about 30 wt %, such as 11 wt %, 12 wt %, 13 wt %, 14 wt %, 15 wt %, 16 wt %, 17 wt %, 18 wt %, 19 wt %, 20 wt %, 22 wt %, 25 wt %, 27 wt %, or 29 wt %.

1.4.1.2. Anhydride

An anhydride refers to an organic compound having two acyl groups bonded to the same oxygen atom. The anhydride is generally formed by dehydrating an organic acid. Examples of the anhydride include but are not limited to a monoanhydride, a dianhydride, a polyanhydride, and a copolymer of the foregoing anhydrides and other copolymerizable monomers. The monoanhydride may be acetic anhydride, maleic anhydride, succinic anhydride and so on. The dianhydride may be naphthalene tetracarboxylic dianhydride, pyromellitic dianhydride and so on. The polyanhydride may be mellitic trianhydride and so on. The copolymer of anhydride and other copolymerizable monomers may be a styrene maleic anhydride copolymer (SMA copolymer).

The SMA copolymer is a copolymer formed by the copolymerization of styrene and maleic anhydride. Without being bound by theory, it is believed that the SMA copolymer used in the epoxy resin-based compositions can provide the effect of lowering the Dk and Df of the electronic materials prepared therefrom. Furthermore, the maleic anhydride functional group can fully react with the epoxy resin functional group, thereby improving the glass transition temperature (Tg) of the prepared electronic materials.

In general, the SMA copolymer can have the following structure of formula (IV):

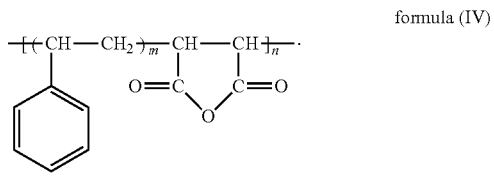

formula (IV)

In formula (IV), m is an integer from 1 to 10 and n is an integer from 8 to 12.

When the resin composition comprises the SMA copolymer presented by formula (IV), the higher the molar ratio of repeating units derived from styrene to repeating units derived from maleic anhydride in the SMA copolymer (i.e., the larger the m value), the lower the Df value of electronic materials prepared from the resin composition (i.e., the better the dielectric properties). Moreover, if the content of repeating units derived from maleic anhydride is pretty low, then the Tg is also relatively low. For example, when m is 1, the Tg of the prepared electronic material is about 155° C.; when m is 8, the Tg of the prepared electronic material is merely about 104° C. Furthermore, when the molar ratio of repeating units derived from styrene to repeating units derived from maleic anhydride is relatively high (e.g. m≥8), the surface of the prepared prepreg will have greater tackiness, which causes the prepregs to easily adhere to each other, thereby causing them to be unfavorable to subsequent processing operations. Conversely, the lower the content of repeating units derived from styrene in the SMA copolymer (i.e., the smaller the m value, e.g. m≤3), the higher the Tg, and the better the heat resistance of the prepared electronic material. However, the prepared electronic material becomes more brittle, which can cause dust generation during subsequent processing. In view of the above, when the resin composition of the present invention comprises the SMA copolymer presented by formula (IV), in the SMA copolymer, the molar ratio of repeating units derived from styrene to repeating units derived from maleic anhydride preferably ranges from about 3 to about 8. The SMA copolymer can be for example, SMA EF-80 (m=8), SMA EF-60 (m=6), SMA EF-40 (m=4), SMA EF-30 (m=3) and SMA EF-3000 (m=3), all available from the Cray Valley company. In the appended Examples, the SMA EF-40 is used.

In the resin composition of the present invention, based on the dry weight of the resin composition excluding the optional filler (C), the content of the SMA copolymer may range from about 10 wt % to about 50 wt %, and particularly from about 20 wt % to about 40 wt %, such as 22 wt %, 24 wt %, 25 wt %, 27 wt %, 28 wt %, 30 wt %, 32 wt %, 33 wt %, 34 wt %, 35 wt %, 37 wt %, 38 wt %, or 39 wt %.

The examples of the crosslinking agent mentioned above, including bismaleimide, anhydride, etc., can either be used alone or in combination. In the resin composition of the present invention, based on the dry weight of the resin composition excluding the optional filler (C), the content of the crosslinking agent may range from about 15 wt % to about 85 wt %, and particularly from about 30 wt % to about 60 wt %, such as 32 wt %, 35 wt %, 36 wt %, 37 wt %, 39 wt %, 40 wt %, 41 wt %, 42 wt %, 45 wt %, 47 wt %, 49 wt %, 50 wt %, 52 wt %, 54 wt %, 55 wt %, 56 wt %, 57 wt %, or 59 wt %.

1.4.2. Co-Crosslinking Agent

In addition to the crosslinking agent, the resin composition of the present invention may further comprise a co-crosslinking agent, thereby further enhancing the properties of the prepared electronic material. Examples of the co-crosslinking agent may include a cyanate ester resin, an amino group-containing compound, an active ester-containing compound, an OH group-containing compound, and so on, wherein each mentioned co-crosslinking agent can either be used alone or in combination. Detailed descriptions for the examples of the crosslinking agent are provided below.

1.4.2.1. Cyanate Ester Resin

As used herein, a cyanate ester resin refers to a chemical substance mainly composed of a derivative of bisphenol or phenol, wherein the hydrogen atom of at least one of hydroxyl group of a derivative of bisphenol or phenol is substituted by a cyano group. The cyanate ester resin usually has an —OCN group, which can form a trimer by a crosslinking reaction. Examples of the cyanate ester resin include but are not limited to 4,4'-ethylidenebisphenylenecyanate, 4,4'-dicyanooxybiphenyl, 2,2-bis(4-cyanooxyphenyl)propane, bis(4-cyanooxy-3,5-dimethylphenyl)methane, bis(4-cyanooxyphenyl) sulfide, bis(4-cyanooxyphenyl) ether, a prepolymer of bisphenol A dicyanate ester in methyl ethyl ketone, 1,1-bis(4-cyanooxyphenyl)ethane, 1,1-bis(4-cyanooxyphenyl)methane, 1,3-bis(4-cyanooxy phenyl-1-(methylethylidene)) benzene, bis(4-cyanooxyphenyl) ether, bis(4-cyanooxyphenyl)-2,2-butane, 1,3-bis[2-(4-cyanooxyphenyl)propyl]benzene, tris(4-cyanooxyphenyl)ethane, cyanated phenol, and an adduct of cyanated phenol dicyclopentadiene. Each mentioned cyanate ester resin can either be used alone or in any combination. Commercially available cyanate ester resins include: PRIMASET PT-15, PRIMASET PT-30S, PRIMASET PT-60S, PRIMASET CT-90, BADCY, BA-100-10T, BA-200, BA-230S, BA-300S, BTP-2500, BTP-6020S, DT-4000, DT-7000, METHYLCY, and ME-240S available from Lonza company.

1.4.2.2. Amino Group-Containing Compound

Examples of the amino group-containing compound include but are not limited to dicyandiamide (DICY), diamino diphenylsulfone (DDS), diamino diphenylmethane (DDM), amino triazine novolac (ATN), and guanamine. The guanamine may include 6-substituted guanamine, such as benzo-guanamine, aceto-guanamine and caprino-guanamine.

1.4.2.3. Active Ester-Containing Compound

As used herein, an active ester-containing compound can be an aromatic polyester obtained by the polymerization reaction of an aromatic dicarboxylic acid (or a derivative thereof) and a bisphenol compound (or a derivative thereof). The polymerization reaction can be carried out by a well-known polymerization method such as solution polymerization, interfacial polymerization, or melt polymerization. Examples of the aromatic dicarboxylic acid include but are not limited to terephthalic acid, isophthalic acid, phthalic acid, chlorophthalic acid, nitrophthalic acid, 2,5-naphthalenedicarboxylic acid, 2,6-naphthalenedicarboxylic acid, 2,7-naphthalenedicarboxylic acid, 1,5-naphthalenedicarboxylic acid, methylterephthalic acid, 4,4'-biphenyldicarboxylic acid, 2,2'-biphenyldicarboxylic acid, 4,4'-diphenyl ether dicarboxylic acid, 4,4'-diphenylmethane dicarboxylic acid, 4,4'-diphenylsulfone dicarboxylic acid, 4,4'-diphenylisopropylidenedicarboxylic acid, 1,2-bis(4-carboxylphenoxy)ethane, and sodium isophthalate-5-sulfonate. Each mentioned aromatic dicarboxylic acid can either be used alone or in any combination. Among the examples of aromatic dicarboxylic acid mentioned above, it is preferable to use terephthalic acid, isophthalic acid, or a mixture thereof, and more preferable to use a mixture of terephthalic acid and isophthalic acid. Examples of the bisphenol compound include but are not limited to bis(4-hydroxyphenyl)phenylmethane, 1,1-bis(4-hydroxyphenyl)-1-phenylethane (bisphenol AP, BPAP), 1,1-bis(4-hydroxy-3-methylphenyl)-1-phenylethane, 1,1-bis(4-hydroxy-3,5-dimethylphenyl)-1-phenylethane, 1,1-bis(4-hydroxy-3,5-dibromophenyl)-1-phenylethane, 1,1-bis(4-hydroxy-3-phenylphenyl)-1-phenylethane, 2,2-bis(4-hydroxyphenyl)propane (bisphenol A, BPA), 2,2-bis(4-hydroxy-3,5-dimethylphenyl)propane (tetramethylbisphenol A), 2,2-bis(4-hydroxy-3-methylphenyl)propane (bisphenol C, BPC), 2,2-bis(4-hydroxy-3,5-dibromophenyl)propane (tetrabromobisphenol A), 2,2-bis(4-hydroxy-3,5-dichlorophenyl)propane (tetrachrolobisphenol A), and a dicyclopentadiene-phenol polymer. Each mentioned bisphenol compound can either be used alone or in any combination. Among the abovementioned bisphenol compounds, it is preferable to use BPA, tetramethylbisphenol A, BPC, tetrabromobisphenol A or tetrachrolobisphenol A. Commercially available bisphenol compounds include HPC-8000-65T available from Japan DIC company, or V575 available from Japan UNITIKA company.

1.4.2.4. OH Group-Containing Compound

Examples of the OH group-containing compound include but are not limited to a bisphenol compound, such as bisphenol A, tetrabromobisphenol A, bisphenol S, or bisphenol F; a dicyclopentadiene (DCPD)-phenol copolymer; and a phenolic novolac resin.

The examples of the co-crosslinking agent mentioned above, including a cyanate ester resin, an amino group-containing compound, an active ester-containing compound, and an OH group-containing compound, can either be used alone or in combination. In the resin composition of the present invention, based on the dry weight of the resin composition excluding the optional filler, the content of the co-crosslinking agent may range from about 2 wt % to about 30 wt % and particularly from about 5 wt % to about 20 wt %.

1.4.3. Flame Retardant

The resin composition of the present invention may further comprise a flame retardant including a halogen-containing flame retardant or a halogen-free flame retardant to increase the flame retardance of the prepared electronic materials. When the resin composition of the present invention has a halogen-free demand, it is obviously preferred to use a halogen-free flame retardant.

Examples of the halogen-free flame retardant include but are not limited to a nitrogen-containing compound, a phosphorus-containing compound, and a metal hypophosphite. Examples of the nitrogen-containing compound include but are not limited to melamine and a derivative thereof (e.g. Melapur 200 from BASF company). Examples of the phosphorus-containing compound include but are not limited to 9,10-dihydro-9-oxa-10-phosphahenanthrene-10-oxide (DOPO) and a derivative thereof (e.g. XZ-92741 from Dow chemical company and XP-7866 from Albemarle company), and phenoxy cyclophosphazene (e.g. SPB-100, SPH-100 and SPV-100 from Otsuka Chemical company), and resorcinol bis[di(2,6-dimethylphenyl)phosphate] (e.g. PX-200, PX-201 and PX-202 from Daihachi Chemical company). Examples of the metal hypophosphite include but are not limited to aluminum hypophosphite (e.g. OP-935 from Clariant company).

The abovementioned examples of the flame retardant can either be used alone or in any combination. In the resin composition of the present invention, based on the dry weight of the resin composition, the content of the flame retardant may range from about 2 wt % to about 20 wt %, and particularly from about 5 wt % to about 15 wt %. When the content of the flame retardant is less than the specified range (for example, less than 2 wt %), it may not provide the desired level of flame retardance; and when the content of the flame retardant is greater than the specified range (for example, more than 20 wt %), it may adversely affect the properties of the prepared electronic materials, for example, deteriorating the dielectric properties of the electronic materials, increasing the hygroscopicity of the electronic materials, and lowering the peeling strength of the electronic materials, etc.

1.4.4. Curing Accelerator

The resin composition of the present invention may further comprise a curing accelerator to promote the epoxy functional group reaction and to lower the curing reaction temperature of the resin composition. The type of the curing accelerator is not particularly limited as long as it can promote the ring-opening reaction of epoxy functional groups and lower the curing reaction temperature. The suitable curing accelerators include but are not limited to tertiary amines, quaternary ammonium salts, imidazoles, or pyridines, wherein each mentioned curing accelerator can either be used alone or in combination. Examples of the tertiary amine include but are not limited to dimethylbenzylamine, 2-dimethylaminomethylphenol, and 2,4,6-tris(dimethylaminomethyl)phenol. Examples of the imidazoles include but are not limited to 2-methylimidazole, 2-ethyl-4-methyl imidazole (2E4MZ), and 2-phenylimidazole. Examples of the pyridines include but are not limited to 2,3-diaminopyridine, 2,5-diaminopyridine, 2,6-diaminopyridine, 4-dimethylaminopyridine, 2-amino-3-methylpyridine, 2-amino-4-methylpyridine, and 2-amino-3-nitropyridine. In addition, the curing accelerator also includes transition metals and oxides thereof, such as zinc or zinc oxide. In the appended Examples, the imidazoles and the transition metals are used.

The abovementioned examples of the curing accelerator can either be used alone or in combination. In general, based on the dry weight of the resin composition excluding the optional filler, the content of the curing accelerator may range from about 0 wt % to about 5 wt %, such as 0.01 wt %, 0.03 wt %, 0.05 wt %, 0.07 wt %, 0.1 wt %, 0.2 wt %, 0.3 wt %, 0.5 wt %, 0.7 wt %, or 3 wt %, but the present invention is not limited thereto. Persons with ordinary skill in the art could adjust the amount of the curing accelerator depending on the need.

1.5. Preparation of Resin Composition

The resin composition of the present invention may be prepared into a varnish for subsequent applications by evenly mixing the epoxy resin, the compound presented by formula (I), the optional filler and other optional components through a stirrer, and dissolving or dispersing the obtained mixture into a solvent. The solvent here can be any inert solvent that can dissolve or disperse the components of the resin composition of the present invention but does not react with the components of the resin composition. Examples of the solvent that can dissolve or disperse the components of the resin composition include but are not limited to toluene, γ-butyrolactone, methyl ethyl ketone, cyclohexanone, butanone, acetone, xylene, methyl isobutyl ketone, N,N-dimethylformamide (DMF), N,N-dimethylacetamide (DMAc), and N-methylpyrolidone (NMP), wherein each mentioned solvent can either be used alone or in combination. The amount of the solvent is not particularly limited as long as the components of the resin composition can be evenly dissolved or dispersed therein. In some embodiments of the present invention, a mixture of toluene, methyl ethyl ketone and γ-butyrolactone is used as the solvent.

2. Prepreg

The present invention also provides a prepreg prepared from the abovementioned resin composition, wherein the prepreg is prepared by impregnating a substrate with the abovementioned resin composition or by coating the abovementioned resin composition onto a substrate and drying the impregnated or coated substrate. Examples of the substrate include but are not limited to glass fiber reinforcing materials (e.g., glass-fiber woven fabrics or non-woven fabrics, glass papers, or glass mats), kraft papers, short fiber cotton papers, nature fiber cloths, and organic fiber cloths (e.g., cloths of liquid crystal polymer fiber). In some embodiments of the present invention, 2116 glass fiber cloth is used as the substrate, and the substrate is heated and dried at 175° C. for 2 to 15 minutes (B-stage) to provide a semi-cured prepreg.

3. Metal-Clad Laminate and Printed Circuit Board

The present invention also provides a metal-clad laminate prepared from the abovementioned prepreg, which comprises a composite layer and a metal layer. The metal-clad laminate can be prepared by laminating the abovementioned prepreg and a metal foil, or by coating the resin composition onto a metal foil and then drying the coated metal foil, wherein the composite layer is provided by the abovementioned prepreg. In the case of the preparation of the metal-clad laminate by using the prepreg, the metal-clad laminate can be prepared by superimposing a plurality of the abovementioned prepregs, superimposing a metal foil (such as a copper foil) on at least one external surface of the composite layer composed of the superimposed prepregs to provide a superimposed object, and then performing a hot-pressing operation onto the superimposed object to obtain the metal-clad laminate.

Furthermore, the metal-clad laminate can form a printed circuit board by further patterning the external metal foil thereof.

4. Examples 4.1. Testing Method

The present invention is further illustrated by the embodiments hereinafter, wherein the testing instruments and methods are as follows:

[Water Absorption Test]

A moisture resistance of the metal-clad laminate is determined by a pressure cooker test (PCT), i.e., subjecting the metal-clad laminate into a pressure container (121° C., saturated relative humidity (100% R.H.) and 1.2 atm) for 5 hours.

[Solder Resistance Test]

A solder resistance test is carried out by immersing the dried metal-clad laminate in a solder bath at 288° C. for a certain period and observing whether there are any defects, such as delamination or blistering. Record the immersion time of the metal-clad laminate in the event of a defect.

[Hygroscopic Solder Resistance Test]

A hygroscopic solder resistance test is carried out by a PCT, i.e., subjecting the metal-clad laminate to the test conditions (121° C., saturated relative humidity (100% R.H.) and 1.2 atm) for 5 hours; then immersing the dried metal-clad laminate in a solder bath at 288° C. for 10 seconds; repeating the abovementioned immersion; and observing whether there is any defect. Record the immersion number of the metal-clad laminate in the event of a defect.

[Peeling Strength Test]

The peeling strength refers to the bonding strength between the metal foil and hot-pressed laminated prepreg and is expressed as the force required to vertically peel clad copper foil with a width of ⅛ inch from the surface of the hot-pressed laminated prepreg. The unit of the peeling strength is pounds per inch (lbf/in).

[Glass Transition Temperature (Tg) Test]

The glass transition temperature (Tg) of the metal-clad laminate is measured by using a Differential Scanning Calorimeter (DSC) or a Thermomechanical Analyzer (TMA), wherein the measuring methods are the IPC-TM-650.2.4.25C and 24C testing method of the Institute for Interconnecting and Packaging Electronic Circuits (IPC).

[Dielectric Constant (Dk) and Dissipation Factor (Df) Measurement]

The dielectric constant (Dk) and dissipation factor (Df) of the metal-clad laminate are measured according to IPC-TM-650 under an operating frequency of 10 GHz. The resin content (RC) of the tested prepreg in the metal-clad laminate is about 70%.

[Heat Resistance Test of 0.8 mm Pitch]

A test substrate with a thickness of about 40 mils is formed by superimposing a plurality of prepregs, wherein 2116 glass fiber cloth is used as the substrate, then respectively superimposing two copper foils on both of the two sides thereof, and carrying out a hot-pressing operation. Subsequently, the test substrate was drilled with a pitch (i.e., a distance between the centers of the two holes) of 0.8 mm with a hole diameter of 0.2 mm and plated with copper to form a plurality of plated through holes. A heat resistance test of 0.8 mm pitch test is carried out by immersing the abovementioned test substrate in a solder bath at 288° C. for 10 seconds; repeating the abovementioned immersion; and observing whether there is any defect. Record the immersion number of the metal-clad laminate in the event of a defect.

[Heat Resistance Test of 0.65 mm Pitch]

A test substrate with a thickness of about 40 mils is formed by superimposing a plurality of prepregs, wherein 2116 glass fiber cloth is used as the substrate, then respectively superimposing two copper foils on both of the two sides thereof, and carrying out a hot-pressing operation. Subsequently, the test substrate was drilled with a pitch (i.e., a distance between the centers of the two holes) of 0.65 mm with a hole diameter of 0.2 mm and plated with copper to form a plurality of plated through holes. A heat resistance test of 0.65 mm pitch test is carried out by immersing the abovementioned test substrate in a solder bath at 288° C. for 10 seconds; repeating the abovementioned immersion; and observing whether there is any defect. Record the immersion number of the metal-clad laminate in the event of a defect.

[Finished Appearance Inspection]

A finished appearance inspection is carried out by visually inspecting the appearance of the prepregs to see if there are any bubbles or rounded fisheyes.

4.2. Raw Materials Used in Examples and Comparative Examples List

TABLE 1

Raw Material List

| Model No. | Description |
|---|---|
| PNE-177 | Phenolic novolac epoxy resin, dry weight of 85%, available from Chang Chun (CCP) Company |
| EP-40 | Crosslinking agent, copolymer of styrene and maleic anhydride, available from Cray Valley Company |
| BMI-5100 | Crosslinking agent, maleimide-based compound, available from Daiwa Fine Chemical Company |
| XZ-92741 | Phosphorus-containing DOPO-based flame retardant, available from Dow Chemical Company |
| SPB-100 | Phosphazene-based flame retardant, available from Otsuka Chemical Company |
| 525 ARI | Surface-treated filler, available from Sibelco Company |
| Zn | Curing accelerator, available from Union Chemical Company |
| 2E4MZ | Curing accelerator, available from Union Chemical Company |
| MEK | Solvent, methyl ethyl ketone, available from ChunKing Technology Company |
| DMF | Solvent, N,N-dimethyl formamide, available from Methyl Company |
| JBZ-OP100N | ODA-type BZ compound, available from JFE Company |
| LZ-8290 | Bisphenol A-type BZ compound, available from Hunstman Company |

4.3. Preparation of Resin Composition

The resin compositions of Examples 1 to 8 and Comparative Examples 1 and 2 were prepared according to the constitutions shown in Tables 2 and 3. In detail, the components were mixed at room temperature with a stirrer, and thereafter, the solvent was added thereinto. After stirring the resultant mixture at room temperature for 60 to 120 minutes, the resin compositions were obtained.

TABLE 2

Constitutions of the resin compositions of Examples 1 to 8

| Unit: Parts by weight | | Examples | | | | | | | |
|---|---|---|---|---|---|---|---|---|---|
| | | 1 | 2 | 3 | 4 | 5 | 6 | 7 | 8 |
| Epoxy resin | PNE-177 | 90 | 90 | 90 | 90 | 90 | 90 | 90 | 90 |
| Crosslinking agent | EF40 | 180 | 180 | 180 | 180 | 180 | 180 | 180 | 180 |
| | BMI-5100 | 90 | 90 | 90 | 90 | 90 | 90 | 90 | 90 |
| BZ compound presented by formula (I) | | 100 | 30 | 40 | 50 | 200 | 300 | 20 | 330 |
| Flame retardant | XZ-92741 | 120 | 120 | 120 | 120 | 120 | 120 | 120 | 120 |
| | SPB-100 | 30 | 30 | 30 | 30 | 30 | 30 | 30 | 30 |
| Filler | 525ARI | 200 | 170 | 175 | 180 | 230 | 260 | 170 | 260 |
| Curing accelerator | 2E4MZ | 0.5 | 0.5 | 0.5 | 0.5 | 0.5 | 0.5 | 0.5 | 0.5 |
| | Zinc | 0.5 | 0.5 | 0.5 | 0.5 | 0.5 | 0.5 | 0.5 | 0.5 |
| Solvent | MEK | 100 | 65 | 65 | 80 | 210 | 300 | 65 | 300 |
| | DMF | 100 | 62 | 62 | 80 | 210 | 300 | 65 | 300 |

TABLE 3

Constitutions of the resin compositions of Comparative Examples 1 and 2

| Unit: Parts by weight | | Comparative examples 1 | 2 |
|---|---|---|---|
| Epoxy resin | PNE-177 | 90 | 90 |
| Crosslinking agent | EF40 | 180 | 180 |
| | BMI-5100 | 90 | 90 |
| Other BZ compound | LZ-8290 | 100 | |
| | JBZ-OP100N | | 100 |
| Flame retardant | XZ-92741 | 120 | 120 |
| | SPB-100 | 30 | 30 |
| Filler | 525ARI | 200 | 200 |
| Curing accelerator | 2E4MZ | 0.5 | 0.5 |
| | Zinc | 0.5 | 0.5 |
| Solvent | MEK | 100 | 100 |
| | DMF | 100 | 100 |

4.4. Preparation and Properties of Metal-Clad Laminate

The metal-clad laminates of Examples 1 to 8 and Comparative Examples 1 and 2 were respectively prepared by using the prepared resin compositions. In detail, one of the resin compositions of Examples 1 to 8 and Comparative Examples 1 and 2 was coated on glass fiber cloths (type: 2116; thickness: 0.08 mm) by a roller at a controlled thickness. The coated glass fiber cloths were then placed in an oven and dried at 175° C. for 2 to 15 minutes to produce prepregs in a half-cured state (B-stage) (the resin content of the prepreg was about 70%). Four pieces of the prepregs were superimposed and two sheets of copper foil (0.5 oz.) were respectively superimposed on both of the two external surfaces of the superimposed prepregs to provide a superimposed object. A hot-pressing operation was performed on each of the prepared objects. The hot-pressing conditions were as follows: heating to about 200° C. to 220° C. at a heating rate of 3.0° C./min, and hot-pressing for 180 minutes under a full pressure of 15 kg/cm$^2$ (initial pressure is 8 kg/cm$^2$) at said temperature.

The properties of the prepregs and metal-clad laminates of Examples 1 to 8 and Comparative Examples 1 and 2, including water absorption, solder resistance, hygroscopic solder resistance, peeling strength, glass transition temperature (Tg), dielectric constant (Dk), dissipation factor (Df), heat resistance test of 0.8 mm pitch, heat resistance test of 0.65 mm pitch, and finished appearance inspection, were measured according to the aforementioned testing methods, and the results are tabulated in Tables 4 and 5.

TABLE 4

Properties of the prepregs and the metal-clad laminates of Examples

| | Unit | Examples | | | | | | | |
|---|---|---|---|---|---|---|---|---|---|
| | | 1 | 2 | 3 | 4 | 5 | 6 | 7 | 8 |
| Water absorption | % | 0.60 | 0.64 | 0.64 | 0.63 | 0.59 | 0.59 | 0.64 | 0.59 |
| Solder resistance | min | >60 | >60 | >60 | >60 | >60 | >60 | >60 | >60 |
| Hygroscopic solder resistance | number | >20 | >20 | >20 | >20 | >20 | 17 | >20 | 16 |
| Peeling strength | lb/inch | 4.2 | 4.4 | 4.3 | 4.2 | 4.1 | 3.6 | 4.4 | 3.6 |
| Tg | ° C. | 179 | 173 | 176 | 177 | 181 | 182 | 171 | 182 |
| Heat resistance of 0.8 mm pitch | number | 26 | 19 | 20 | 20 | 25 | 17 | 19 | 16 |
| Heat resistance of 0.65 mm pitch | number | 22 | 14 | 15 | 16 | 22 | 12 | 15 | 12 |
| Whether there are fisheyes in finished appearance | | No | No | No | No | No | No | No | No |
| Dk @ 10 GHz | | 3.6 | 3.6 | 3.6 | 3.6 | 3.6 | 3.6 | 3.6 | 3.6 |
| Df @ 10 GHz | | 0.0068 | 0.0081 | 0.0078 | 0.0073 | 0.0065 | 0.0064 | 0.0083 | 0.0064 |

TABLE 5

Properties of the prepregs and the metal-clad laminates of Comparative Examples

|  | Unit | Comparative Examples 1 | Comparative Examples 2 |
|---|---|---|---|
| Water absorption | % | 0.62 | 0.64 |
| Solder resistance | min | >60 | >60 |
| Hygroscopic solder resistance | number | >20 | 15 |
| Peeling strength | lb/inch | 3.8 | 4.2 |
| Tg | ° C. | 172 | 183 |
| Heat resistance of 0.8 mm pitch | number | 18 | 12 |
| Heat resistance of 0.65 mm pitch | number | 11 | 6 |
| Whether there are fisheyes in finished appearance |  | No | Yes |
| Dk @ 10 GHz |  | 3.8 | 3.9 |
| Df @ 10 GHz |  | 0.009 | 0.008 |

As shown in Table 4, each of the electronic materials prepared from the resin composition of the present invention exhibit satisfactory physicochemical properties and dielectric properties (e.g. water absorption, solder resistance, hygroscopic solder resistance, peeling strength, Tg, Dk, Df, and so on). Furthermore, regarding the appearance, the electronic materials do not have fisheyes, and also exhibit outstanding heat resistance during the 0.8 mm pitch heat resistance test and the 0.65 mm pitch heat resistance test. As shown in Examples 1 to 8, when the content of the compound represented by formula (I) is higher, the Df of the obtained electronic material is lower and the Tg is higher, but the solder resistance and the peeling strength slightly deteriorate. Therefore, for a desirable balance of each of the properties of the electronic material, based on the dry weight of the resin composition excluding the optional filler, the content of the compound represented by formula (I) ranges from about 6 wt % to about 40 w %. The abovementioned range is preferred because, when the content of the compound represented by the formula (I) is less than 6 wt % or more than 40 wt %, as shown in Examples 7 and 8, in some applications, the Tg, the Df, the solder resistance and the heat resistance for drilling of the prepared metal-clad laminate may not be satisfactory. Moreover, as shown in Examples 1 and 5, when the content of the compound represented by formula (I) ranges from about 18 wt % to about 32 wt %, based on the dry weight of the resin composition excluding the optional filler, the electronic materials exhibit satisfactory physicochemical properties and dielectric properties as well as particularly outstanding heat resistance during the 0.8 mm pitch heat resistance test and the 0.65 mm pitch heat resistance test.

In contrast, as shown in Table 5, electronic materials prepared by using resin compositions other than that of the present invention cannot achieve a satisfactory level in all physicochemical properties and dielectric properties, and do not exhibit a good finished appearance and outstanding heat resistance for drilling. Specifically, as shown in Comparative Examples 1 and 2, when the resin compositions do not comprise the compound represented by formula (I), the prepared electronic materials have a slightly high Df and poor heat resistance. In addition, the electronic material prepared by using the resin composition (Comparative Example 2) containing an ODA-type BZ compound particularly has more noticeable fisheyes.

The above examples are used to illustrate the principle and efficacy of the present invention and show the inventive features thereof. People skilled in this field may proceed with a variety of modifications and replacements based on the disclosures and suggestions of the invention as described without departing from the principle and spirit thereof. Therefore, the scope of protection of the present invention is that as defined in the claims as appended.

What is claimed is:

1. A resin composition, comprising:
(A) an epoxy resin;
(B) a compound of formula (I),

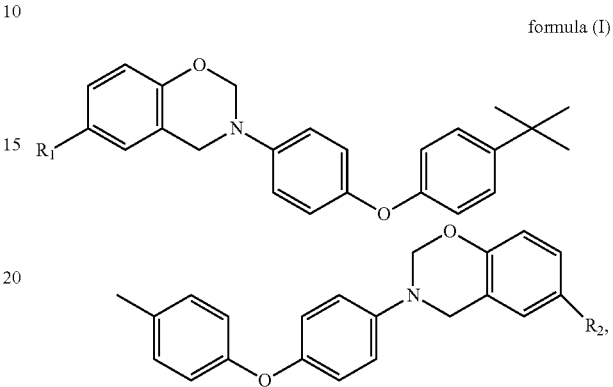

formula (I)

wherein, in formula (I), $R_1$ and $R_2$ are independently —H;
(C) a filler;
a crosslinking agent, which comprises a maleimide-based compound and an anhydride;
a curing accelerator; and
a flame retardant,
wherein, based on the dry weight of the resin composition excluding the filler (C), the content of the compound (B) of formula (I) ranges from 15 wt % to 28 wt %,
based on the dry weight of the resin composition excluding the filler (C), the content of the epoxy resin (A) ranges from about 5 wt % to about 30 wt %,
based on the dry weight of the resin composition, the content of the filler (C) ranges from 2 wt % to about 40 wt %, and
based on the dry weight of the resin composition, the content of the flame retardant ranges from about 2 wt % to about 20 wt %.

2. The resin composition of claim 1, wherein the optional filler (C) is selected from the group consisting of silicon dioxide, aluminum oxide, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartz, diamond, diamond-like, graphite, calcined kaolin, pryan, mica, hydrotalcite, polytetrafluoroethylene (PTFE) powder, glass bead, ceramic whisker, carbon nanotube, nanosized inorganic powder, and combinations thereof.

3. The resin composition of claim 1, wherein the maleimide-based compound is the compound of formula (II):

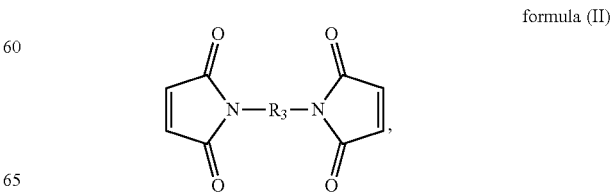

formula (II)

wherein, in formula (II), $R_3$ is methylene (—$CH_2$—), 4,4'-diphenylmethane group

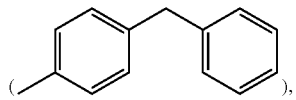

m-phenylene

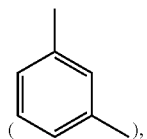

bisphenol A diphenyl ether group

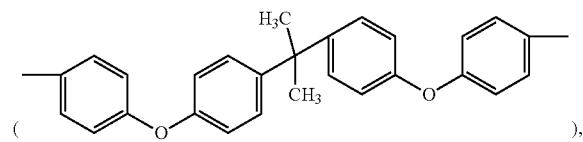

3,3'-dimethyl-5,5'-diethyl-4,4'-diphenylmethane group

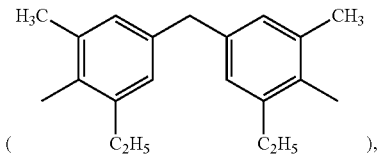

4-methyl-1,3-phenylene

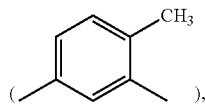

or 2,2,4-trimethyl-1,6-hexamethylene

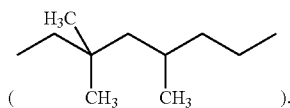

4. The resin composition of claim 3, wherein $R_3$ is 3,3'-dimethyl-5,5'-diethyl-4,4'-diphenylmethane group

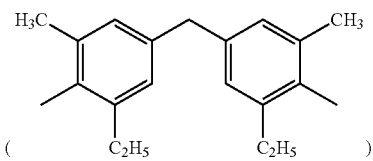

5. The resin composition of claim 1, wherein the anhydride is a copolymer of styrene and maleic anhydride (SMA copolymer).

6. The resin composition of claim 5, wherein, in the copolymer of styrene and maleic anhydride, the molar ratio of repeating units derived from styrene to repeating units derived from maleic anhydride is about 3 to about 8.

7. The resin composition of claim 6, wherein, in the copolymer of styrene and maleic anhydride, the molar ratio of repeating units derived from styrene to repeating units derived from maleic anhydride is about 3.5 to about 4.5.

8. The resin composition of claim 1, further comprising a co-crosslinking agent selected from the group consisting of a cyanate ester resin, an OH group-containing compound, an amino group-containing compound, an active ester-containing compound, and combinations thereof.

9. The resin composition of claim 1, further comprising at least one of a dispersing agent and a coupling agent.

10. A prepreg, which is prepared by impregnating a substrate with the resin composition of claim 1 or by coating the resin composition of claim 1 onto a substrate and drying the impregnated or coated substrate.

11. A metal-clad laminate, which is prepared by laminating the prepreg of claim 10 and a metal foil.

12. A printed circuit board, which is prepared from the metal-clad laminate of claim 11.

13. A metal-clad laminate, which is prepared by coating the resin composition of claim 1 onto a metal foil and drying the coated metal foil.

14. A printed circuit board, which is prepared from the metal-clad laminate of claim 13.

\* \* \* \* \*